(12) United States Patent
Chen

(10) Patent No.: US 7,586,748 B2
(45) Date of Patent: Sep. 8, 2009

(54) CLASP DEVICE FOR A HANDLE OF A POWER SUPPLY

(75) Inventor: Richard Chen, San Jose, CA (US)

(73) Assignee: Super Micro Computer, Inc., San Jose, CA (US)

( * ) Notice: Subject to any disclaimer, the term of this patent is extended or adjusted under 35 U.S.C. 154(b) by 126 days.

(21) Appl. No.: 11/790,090

(22) Filed: Apr. 23, 2007

(65) Prior Publication Data

US 2008/0259530 A1 Oct. 23, 2008

(51) Int. Cl.
*H05K 7/16* (2006.01)
(52) U.S. Cl. ............... 361/727; 361/695; 16/110.1; 439/372
(58) Field of Classification Search ......... 361/622, 361/687, 695, 724–727; 454/184; 439/372; 415/126, 213.1
See application file for complete search history.

(56) References Cited

U.S. PATENT DOCUMENTS 6,040,981 A * 3/2000 Schmitt et al. ............. 361/695
6,222,736 B1 * 4/2001 Sim et al. .................. 361/727
7,414,860 B1 * 8/2008 Chen ......................... 361/801
2007/0186378 A1 * 8/2007 Liang ....................... 16/110.1

* cited by examiner

*Primary Examiner*—Jayprakash N Gandhi
*Assistant Examiner*—Courtney Smith
(74) *Attorney, Agent, or Firm*—Troxell Law Office PLLC

(57) ABSTRACT

A clasp device for a handle of a power supply, which includes:

A power supply; a U-shaped handle are movably joined to left and right sidewalls of the power supply; a spring piece respectively provided with a pressure plate and a base plate, wherein two sides of the base plate are fixedly connected to the transversal plate, a gap is formed between the pressure plate and another inner plate surface of the transversal plate, and a protruding portion is located at the base plate; a clasp hole defined in a side plate surface of the power supply; when the U-shaped handle is rotary displaced about shaft tips as center, the protruding portion clasps into/separates from the clasp hole, which prevents the entire spring piece from protruding from the surface of the handle, thereby avoiding hindrance to external objects.

6 Claims, 6 Drawing Sheets

US 7,586,748 B2

CLASP DEVICE FOR A HANDLE OF A POWER SUPPLY

BACKGROUND OF THE INVENTION (a) Field of the Invention

The present invention provides a clasp device for a handle of a power supply, and more particularly to a U-shaped handle which, when grasped and upwardly raised to produce an upward rotary displacement or a downward rotary displacement by an operator, facilitates convenient and fast control of the handle to ensure whether or not the handle is fixedly clasped to a power supply.

(b) Description of the Prior Art

A typical prior art structure, such as a former U.S. Ser. No. 11/353,101 patent application of the applicant, includes a spring piece fixedly joined to an outer surface of a handle, and operational displacement of the spring piece enables controlling whether or not a protruding portion is clasped into a clasp groove.

However, the spring piece protrudes from the outer surface of the handle; thereby easily hindering external objects, moreover, aesthetic appearance of the entire power supply is seriously impaired.

Hence, subject of the present invention is to resolve and surmount existent technical difficulties to design a spring piece that does not protrude from the outer surface of the handle, and, at the same time, enables implementing convenient and fast position fixing of the handle to or separating the handle from a power supply.

SUMMARY OF THE INVENTION

A primary objective of the present invention is to provide a clasp device for a handle of a power supply, wherein a spring piece is movably located on an inner plate surface of a transversal plate of a handle. When the spring piece is pressed, a protruding portion is made to leave position within a clasp hole on a power supply, and causes the handle to rotate. When the handle is downwardly rotated and made to join alongside the power supply, then the protruding portion is made to clasp within the clasp hole, which prevents the entire spring piece from protruding from the surface of the handle, thereby avoiding hindrance to external objects; moreover, aesthetic appearance of the entire handle is improved.

To enable a further understanding of said objectives and the technological methods of the invention herein, brief description of the drawings is provided below followed by detailed description of the preferred embodiments.

DETAILED DESCRIPTION OF THE PREFERRED EMBODIMENTS

Figure 1:
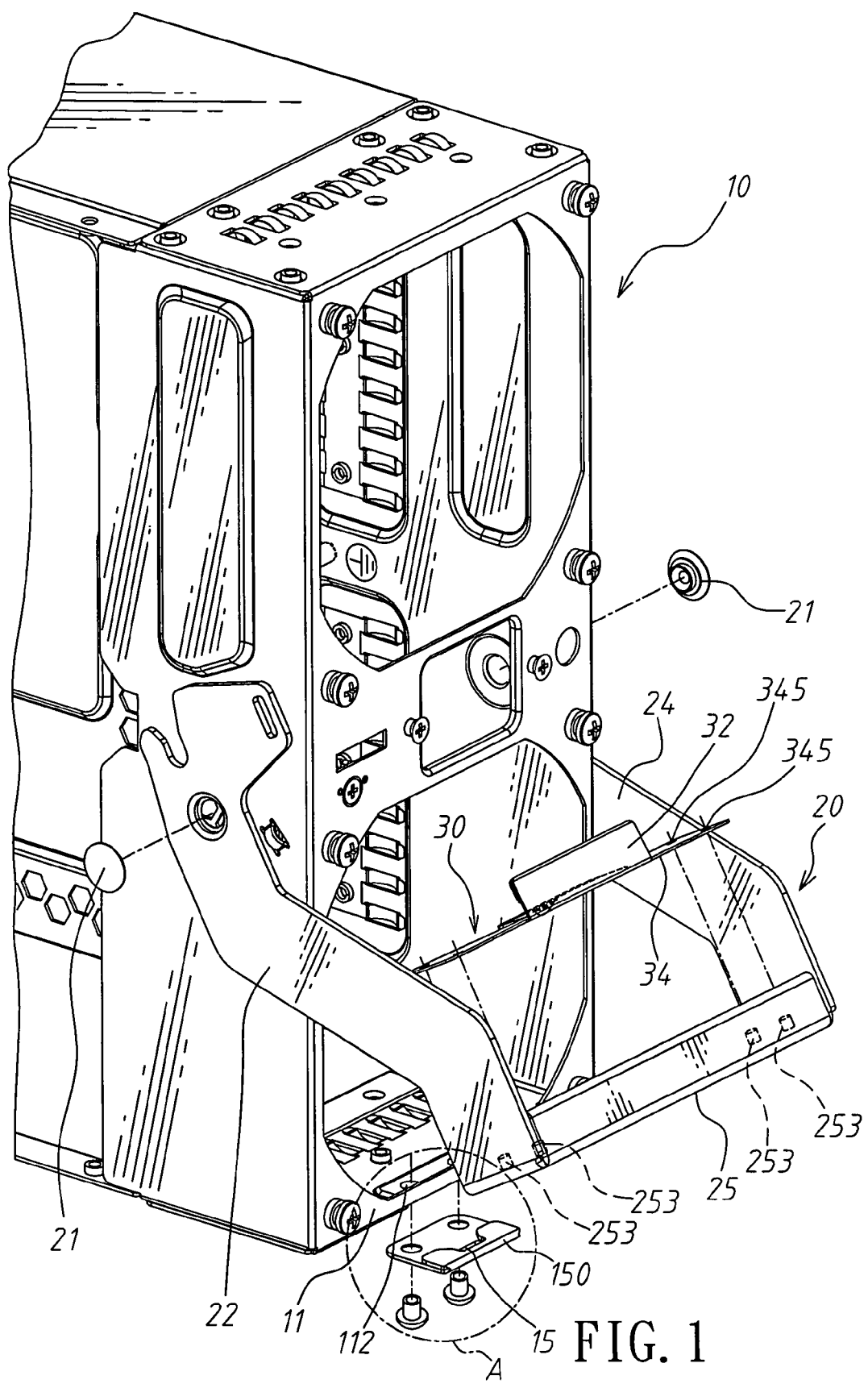
FIG. 1 shows an exploded elevational view depicting local components of a power supply and a handle according to the present invention.
Figure 2:
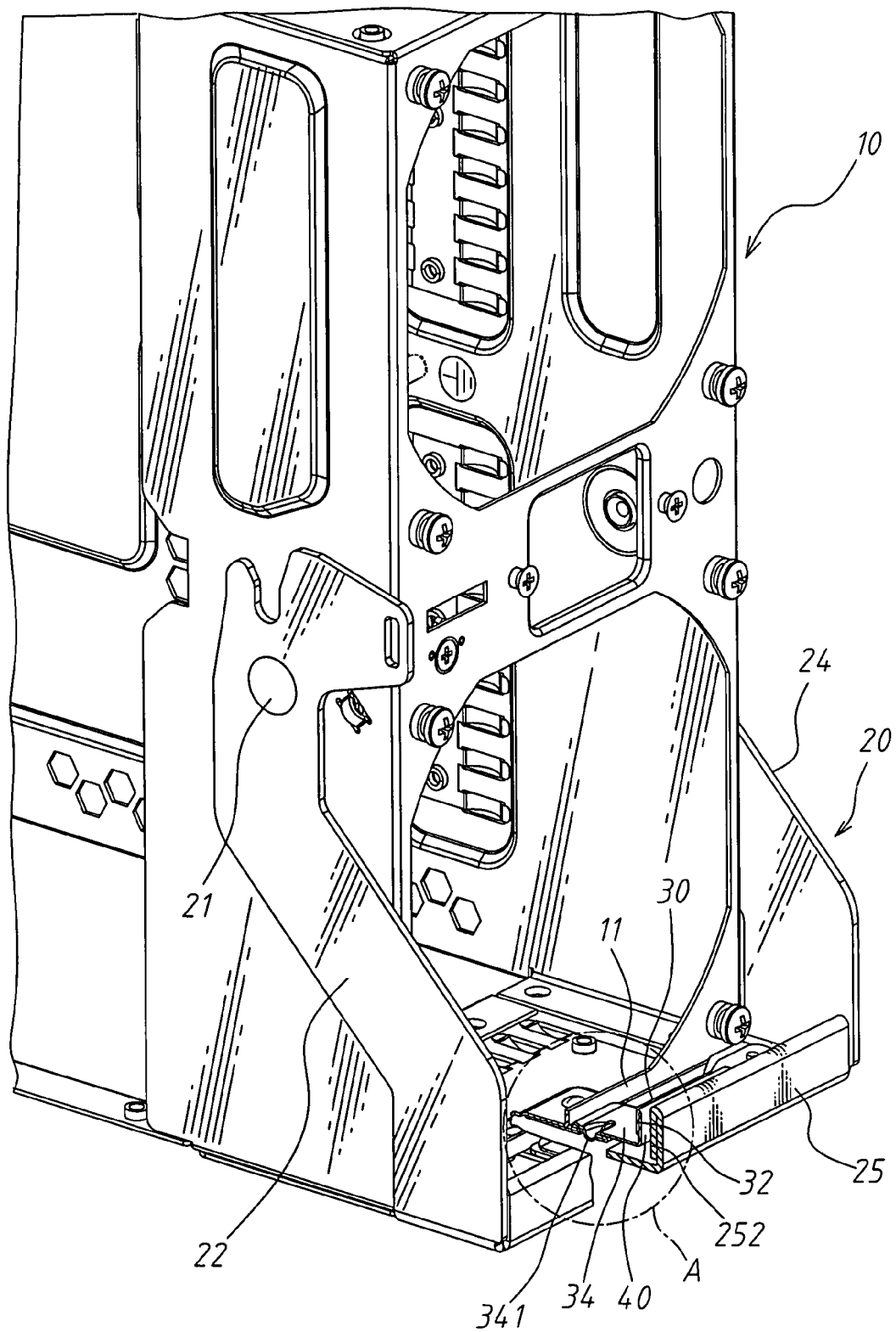
FIG. 2 shows a partial elevational view and a partial cutaway view of the assembled power supply and handle according to the present invention.
Figure 3:
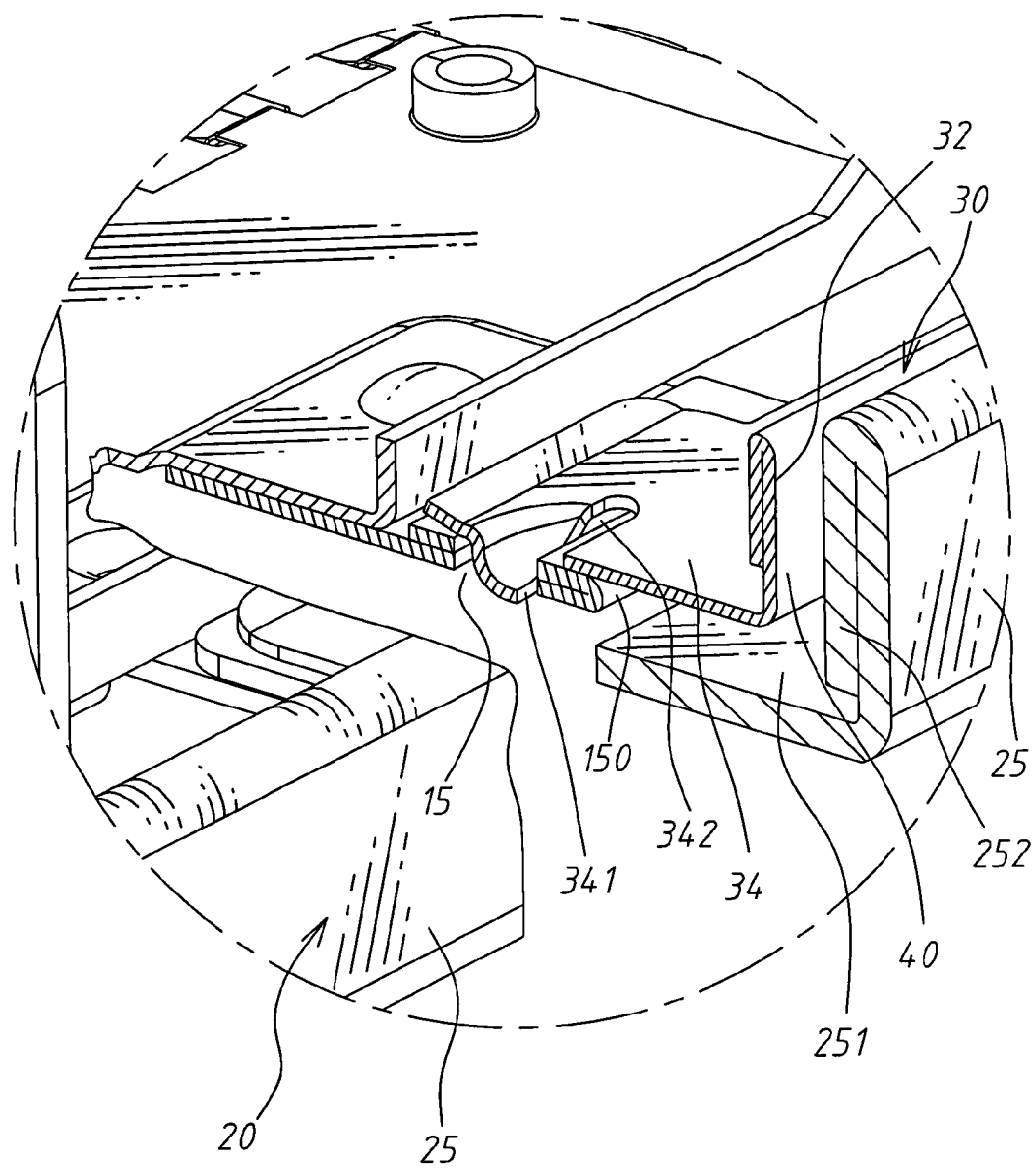
FIG. 3 shows an enlarged view of area A of FIG. 2.

Referring to FIGS. 1, 2 and 3, which show the clasp device for a handle of a power supply of the present invention comprising:

A power supply 10;

A U-shaped handle 20, left and right side plates 22, 24 of which are movably joined to left and right sidewalls of the power supply 10 respectively by means of shaft tips 21. A transversal plate 25 having an L-shaped cross section is provided with an inner plate surface 251;

A spring piece 30, having an L-shape cross section, respectively provided with a pressure plate 32 and a base plate 34, wherein two sides of the base plate 34 are fixedly connected to the transversal plate 25. A gap 40 is formed between the pressure plate 32 and another inner plate surface 252 of the transversal plate 25. A protruding portion 341 is located at a somewhat central position of the base plate 34;

A clasp hole 15 defined in a front end of a side plate surface 11 of the power supply 10.

Figure 6:
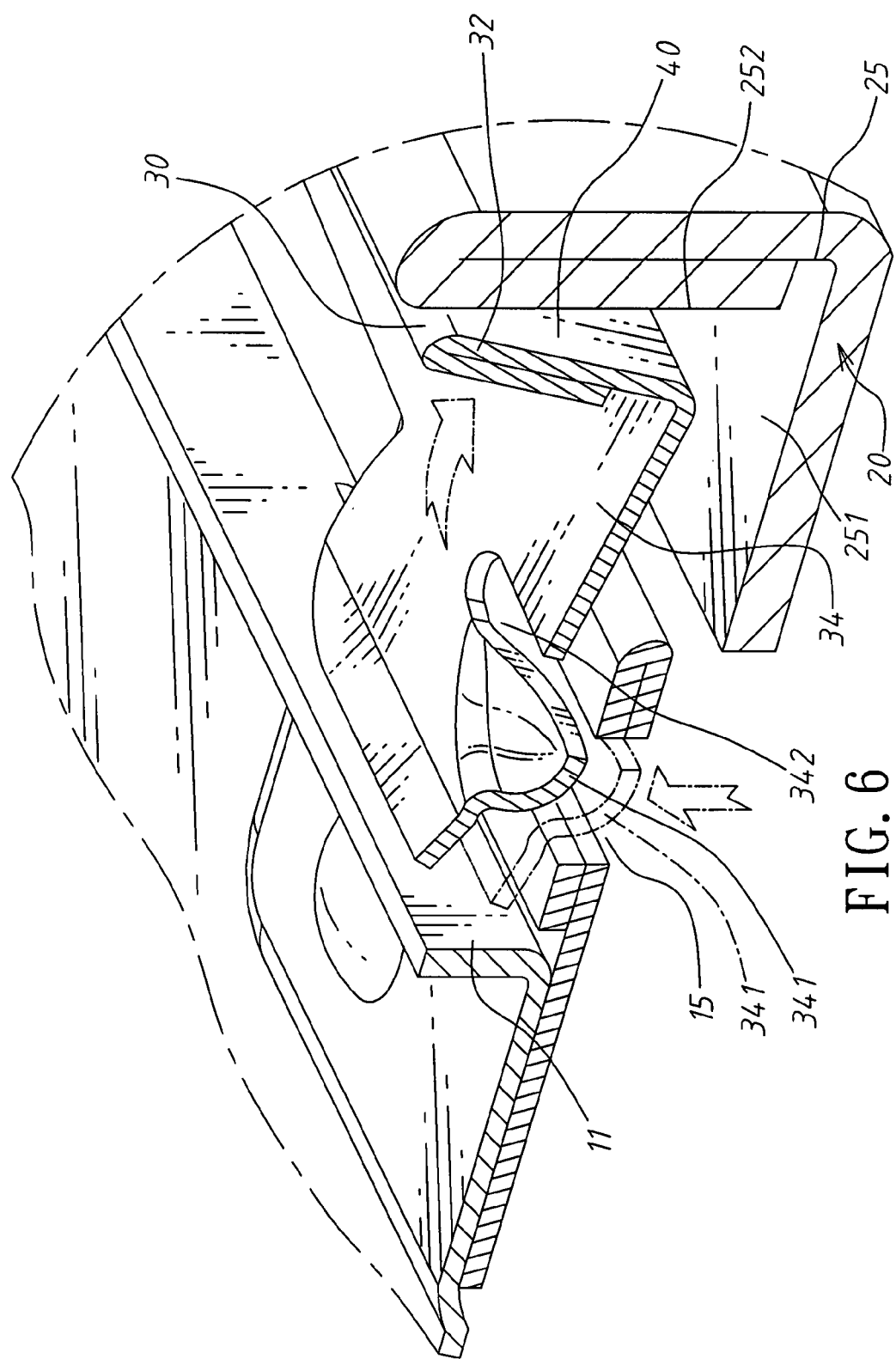
FIG. 6 shows an elevational schematic view depicting movement of FIG. 3.

When the U-shaped handle 20 is rotary displaced about the shaft tips 21 as center, the protruding portion 341 clasps into/separates from the clasp hole 15 (see FIG. 6).

Referring to FIG. 1, which shows the clasp hole 15 defined in a rectangular piece 150, and the rectangular piece 150 is fixedly joined to connecting holes 112 of an inner side of the side plate surface 11 of the power supply 10, thereby enabling the clasp hole 15 to be positioned at an anterior lower portion of the side plate surface 11.

Figure 4:
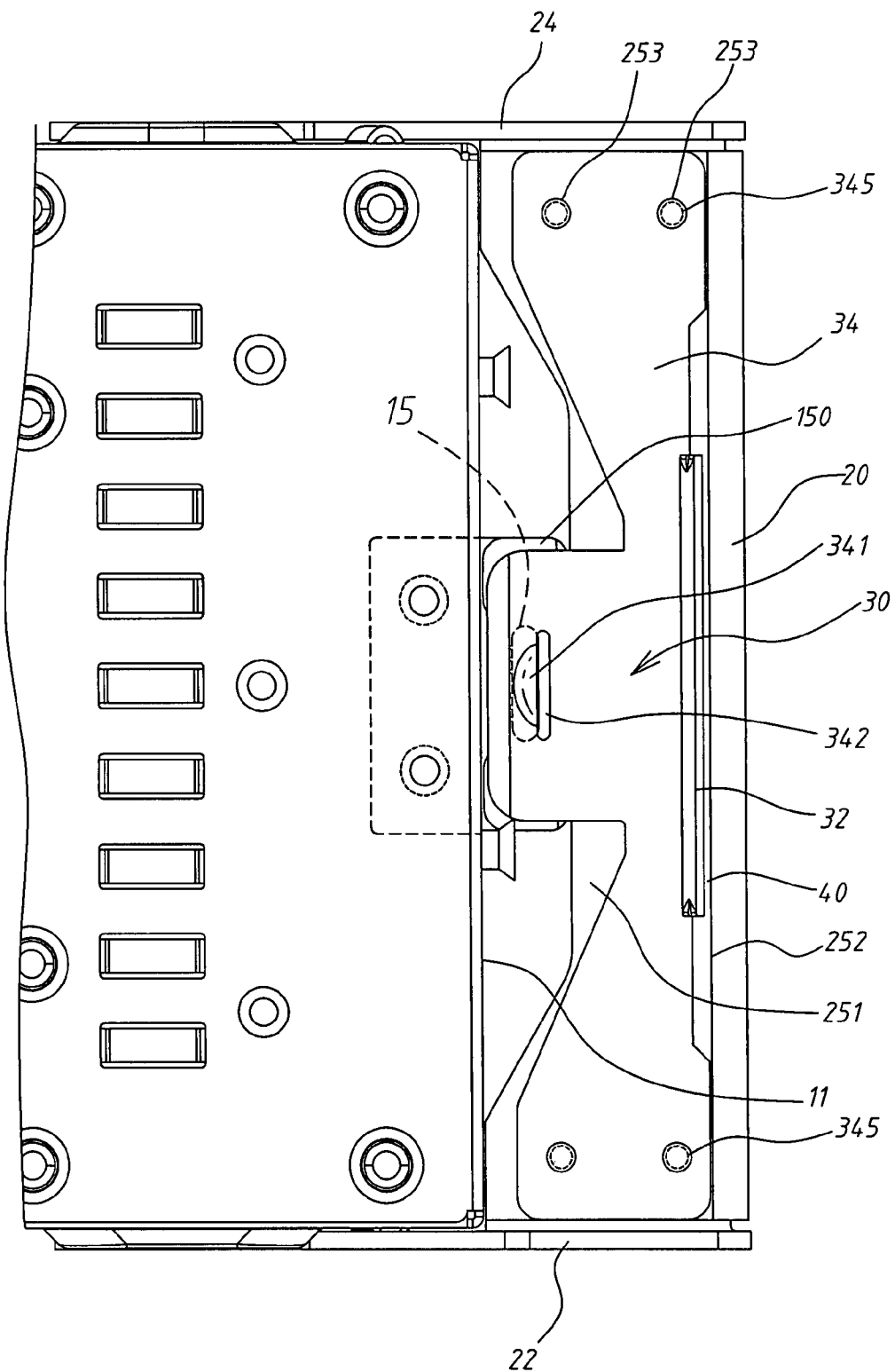
FIG. 4 shows a plane view depicting the power supply and handle after assembling and positioning according to the present invention.
Figure 5:
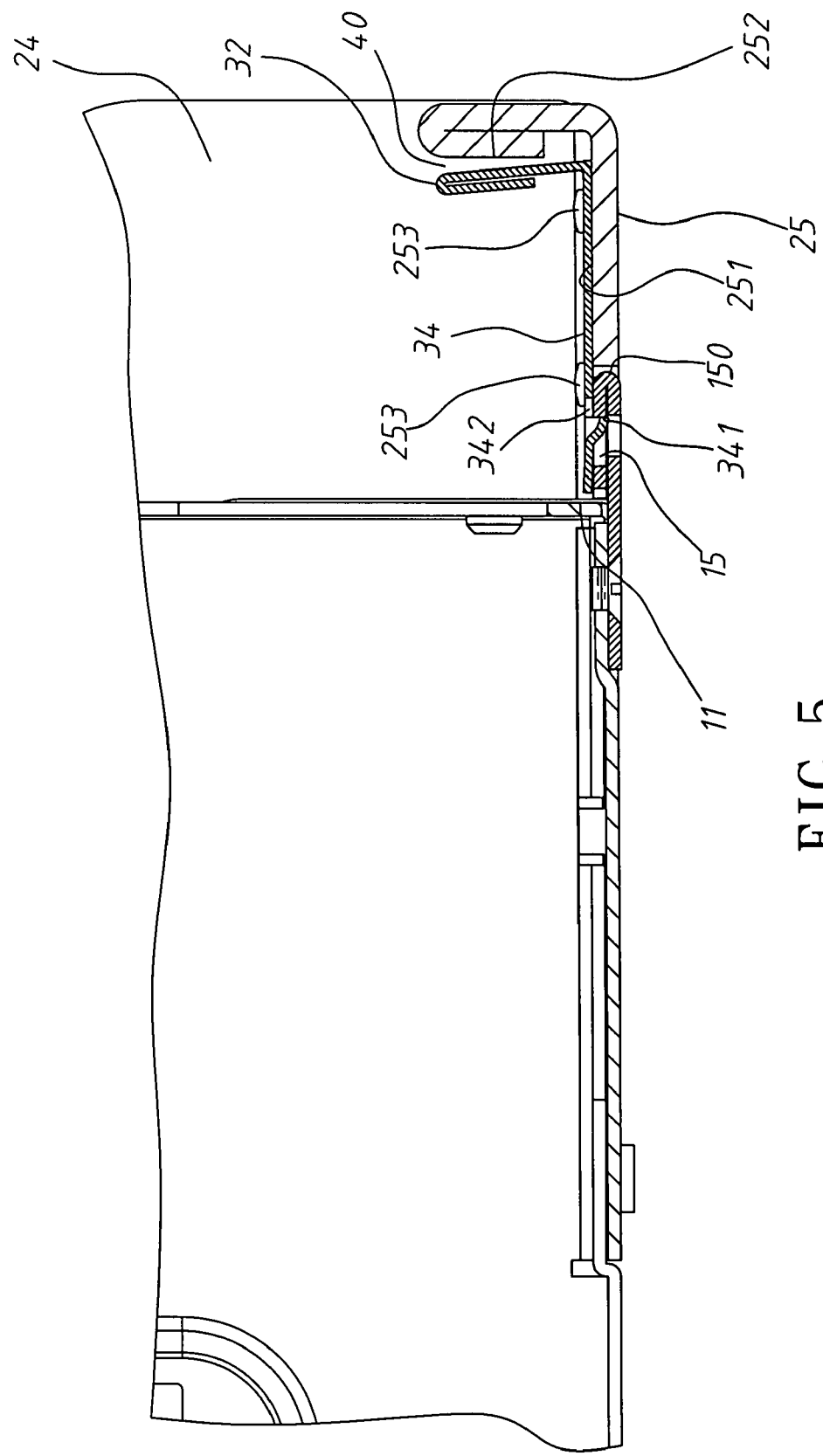
FIG. 5 shows a partial cross-sectional view depicting the power supply and handle after assembling and positioning according to the present invention.

Referring to FIGS. 1 and 4, which show two sides of the base plate 34 respectively defined with connecting holes 345.

Rivets 253 are located on the inner plate surface 251 of the transversal plate 25, and the rivets 253 are punch joined to the connecting holes 345, thereby fixing the base plate 34 to the inner plate surface 251 of the transversal plate 25.

Referring to FIG. 6, which shows the pressure plate 32 of the spring piece 30 being subjected to pressing, thereby obliquely displacing the pressure plate 32 towards the direction of the inner plate surface 252, and closing the gap 40, at which time the base 34 is obliquely prized upwards, and the protruding portion 341 is upwardly separated from the clasp hole 15, thus causing the handle 20 to be rotary displaced.

Referring again to FIG. 6, when the handle 20 is rotary displaced in a clockwise direction, then the transversal plate 25 is made to join alongside the side plate surface 11 of the power supply 10, whereupon the pressure plate 32 of the spring piece 30 assumes a free state, at which time the gap 40 is formed, the protruding portion 341 clasps into the clasp hole 15 (see the imaginary line portion of FIG. 6), and the handle 20 is fixedly secured to the power supply 10.

Referring again to FIG. 6, which shows a long notch 342 formed at one side of the protruding portion 341, thereby providing the protruding portion 341 with good pliability, and enabling even easier clasping into/separating from the clasp hole 15.

Referring to FIG. 4, which shows an L-shaped spring piece 30 provided with elastic characteristics and a protruding portion 341 provided with an arc form. When the fingers press a pressure plate 32, then the pressure plate 32 is elastically deformed and obliquely displaced in the direction of a rear inner plate surface 252: When the pressure plate 32 contacts the inner plate surface 252, then a gap 40 is closed (see FIG. 6) and the protruding portion 341 is prized upwards, thereby causing the protruding portion 341 to separate from a clasp hole 15. When fingers of an operator grasp a transversal plate 25 and an entire U-shaped handle 20 is rotary displaced in an anticlockwise direction about shaft tips 21 as center, then the fingers are able to horizontally pull out a power supply 10.

Similarly, when the handle 20 is rotary displaced in a clockwise direction through an angle about the shaft tips 21 as center, then a front end of a base 34 of the handle 20 is made to join alongside a side plate surface 11 of the power supply 10. After the protruding portion 341 enters the corresponding clasp hole 15, then pressing of the fingers is released from the pressure plate 32, whereupon the entire spring piece 30 freely repositions and the gap 40 is formed, at which time the protruding portion 341 clasps into the clasp hole 15, and the entire U-shaped handle 20 is fixedly secured to the power supply 10 (see FIG. 3). In conclusion, when a hand grasps the transversal plate 25, thereby enabling the fingers to grip the pressure plate 32, then the mechanistic configuration of the present invention facilitates achievement of convenient and fast operational positioning and rotating of the handle 20. More particularly, the spring piece 30 is concealed by an Inner surface of the transversal plate 25, and thus does not hinder external objects and ensures aesthetic appearance of the handle 20.

It is of course to be understood that the embodiments described herein are merely illustrative of the principles of the invention and that a wide variety of modifications thereto may be effected by persons skilled in the art without departing from the spirit and scope of the invention as set forth in the following claims.

What is claimed is:

1. A clasp device for a handle of a power supply, comprising:
    a power supply;
    a U-shaped handle, left and right side plates of which are movably joined to left and right sidewalls of the power supply respectively by means of shaft tips, and a transversal plate having a L-shaped cross section is provided with an inner plate surface;
    a spring piece, having a L-shape cross section, respectively provided with a pressure plate and a base plate, wherein two sides of the base plate are fixedly connected to the inner surface of the transversal plate, a gap is formed between the pressure plate and another inner plate surface of the transversal plate, and a protruding portion is located at a somewhat central position of the base plate;
    a clasp hole defined in a front end of a side plate surface of the power supply;
    when the U-shaped handle is rotary displaced about the shaft tips as center, the protruding portion clasps into/ separates from the clasp hole,
    wherein the spring piece is located between the transversal plate and the side plate surface of the power supply when the clasp device is in a closed position.

2. The clasp device for a handle of a power supply according to claim 1, wherein the clasp hole is defined in a rectangular piece, and the rectangular piece is fixedly joined to connecting holes of an inner side of the side plate surface of the power supply, thereby enabling the clasp hole to be positioned at an anterior lower portion of the side plate surface.

3. The clasp device for a handle of a power supply according to claim 1, wherein two sides of the base plate are respectively defined with connecting holes; rivets are located on the inner plate surface of the transversal plate, and the rivets are punch joined to the connecting holes, thereby fixing the base plate to the inner plate surface of the transversal plate.

4. The clasp device for a handle of a power supply according to claim 1, wherein subjecting the pressure plate of the spring piece to pressing causes the pressure plate to obliquely displace towards the direction of the inner plate surface, thereby closing the gap, at which time the base is obliquely prized upwards and the protruding portion is upwardly separated from the clasp hole, and the handle is thereby rotary displaced.

5. The clasp device for a handle of a power supply according to claim 1, wherein rotary displacement of the handle in a clockwise direction causes the transversal plate to join alongside the side plate surface of the power supply, whereupon the pressure plate of the spring piece assumes a free state, thereby forming the gap, and the protruding portion is made to clasp into the clasp hole and the handle is fixedly secured to the power supply.

6. The clasp device for a handle of a power supply according to claim 1, wherein a long notch is formed at one side of the protruding portion, thereby providing the protruding portion with good pliability, and enabling easier clasping into/ separating from the clasp hole.

* * * * *